United States Patent [19]

Thomas et al.

[11] Patent Number: 5,500,784
[45] Date of Patent: Mar. 19, 1996

[54] ELECTRICAL DEVICE, IN PARTICULAR SWITCHING OR CONTROLLING DEVICE FOR MOTOR VEHICLE

[75] Inventors: Gerhard Thomas, Fuerth; Karl Wutz, Sengenthal; Klaus Lechner, Eckental, all of Germany

[73] Assignee: Robert Bosch GmbH, Stuttgart, Germany

[21] Appl. No.: 301,294

[22] Filed: Sep. 6, 1994

[30]     Foreign Application Priority Data

Dec. 18, 1993  [DE]  Germany ........................... 43 43 355.3

[51] Int. Cl.⁶ ..................................................... H05K 7/20
[52] U.S. Cl. ........................... 361/704; 211/41; 257/727; 361/707; 361/720
[58] Field of Search ...................... 267/150, 160; 165/80.3, 185; 257/712, 713, 719, 726, 727; 174/16.3; 211/41; 439/485, 487, 76; 361/689, 704, 707, 711, 717–719, 720, 752, 796, 802

[56]     References Cited

U.S. PATENT DOCUMENTS

| | | | |
|---|---|---|---|
| 3,631,325 | 12/1971 | Wenz | 317/100 |
| 3,845,359 | 10/1974 | Fedele | 211/41 |
| 4,923,179 | 5/1990 | Mikolajczak | 267/160 |
| 5,200,882 | 4/1993 | Blomquist | 361/386 |
| 5,402,313 | 3/1995 | Casperson | 361/710 |

*Primary Examiner*—Gerald P. Tolin
*Attorney, Agent, or Firm*—Michael J. Striker

[57]     ABSTRACT

An electrical device for a motor vehicle comprises a housing, a printed board carrying an electric circuit and arranged in the housing, the housing being provided with a plurality of webs for abutting the printed board and an elastic element by which the printed board is pressed on the webs.

11 Claims, 2 Drawing Sheets

ELECTRICAL DEVICE, IN PARTICULAR SWITCHING OR CONTROLLING DEVICE FOR MOTOR VEHICLE

BACKGROUND OF THE INVENTION

The present invention relates to an electrical device, in particular a switching or control device for a motor vehicle.

More particularly, it relates to an electrical device for a motor vehicle which has a housing, has a printed board carrying an electric circuit.

Electrical devices of the above mentioned general type are known in the art. The printed board in such electrical devices is usually mounted by screws on the bottom plate of the housing of the electrical switching device. Cooling bodies provided in the device transmit the heat of the power components located on the printed board to the housing wall and therefore withdraw the heat from them. During the mounting several steps however are needed. In particular fixed connections must be produced, therefore the mounting is relatively complicated and expensive. For individual functions, for example for withdrawal of the lost heat, individual components such as cooling bodies are needed. Therefore additional space for these components is required. Also, recycling problems arise in connection with the cooling bodies.

SUMMARY OF THE INVENTION

Accordingly, it is an object of the present invention to provide an electrical device of the above mentioned general type, in particular a switching device or control device for a motor vehicle, which avoids the disadvantages of the prior art.

In keeping with these objects and with others which will become apparent hereinafter, one feature of the present invention resides, briefly stated, in an electrical device having a housing and at least one printed board carrying an electrical circuit and arranged on the housing, wherein the housing is provided with several webs for abutment of the printed board, and the printed board is pressed by means of at least one elastic element onto the webs.

When the device is designed in accordance with the present invention the printed board can be arranged in the housing of the device in a space economical manner with low manufacturing expenses. The lost heat of the power components is transmitted through the abutment webs. Thereby the electrical device is formed in a very space economical mounting-friendly manner. The utilized parts are recyclable. The printed boards are pressed by means of springs onto the stage in a simple and fast mounting process.

When the housing is produced by die casting, the abutment webs for the printed boards are produced already during casting of the housing as so-called drafts of the mold. Thereby the abutment webs or the raised surfaces for the printed boards are already available during the manufacturing process.

For further simplification, the springs can be formed on the plug, so that the springs during insertion of the plug in the housing simultaneously fix the printed board on the abutment webs. Since the surface of the abutment webs has a slight inclination, a reliable hold of the printed board on the housing is guaranteed.

For improving the heat withdrawal through the abutment webs, through contactings are possible in the printed board. For this purpose, copper intermediate layers or in other words copper layers between the printed board and the abutment surface, are utilized. The copper layers provide a relatively high heat withdrawal. By means of insulating layers, an electrical potential separation between the printed board and the die casting housing is provided.

In accordance with another feature of the present invention the housing is provided with guiding elements which are located opposite to the webs and on which the elastic elements can slide along.

The webs can have surfaces which are raising in the insertion direction of the printed board. The surface of the guiding elements which faces the printed board can have surfaces which raise in the insertion direction of the printed board.

The elastic elements can be formed with their free ends with a zig-zag shape, it can be provided with a projection formed on the plug strip, it can be arranged on the printed board, it can be composed of an elastic material such as a synthetic plastic material or metal.

Finally, the printed board can be provided with a heating power component, and the housing can be composed of a heat conductive material.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
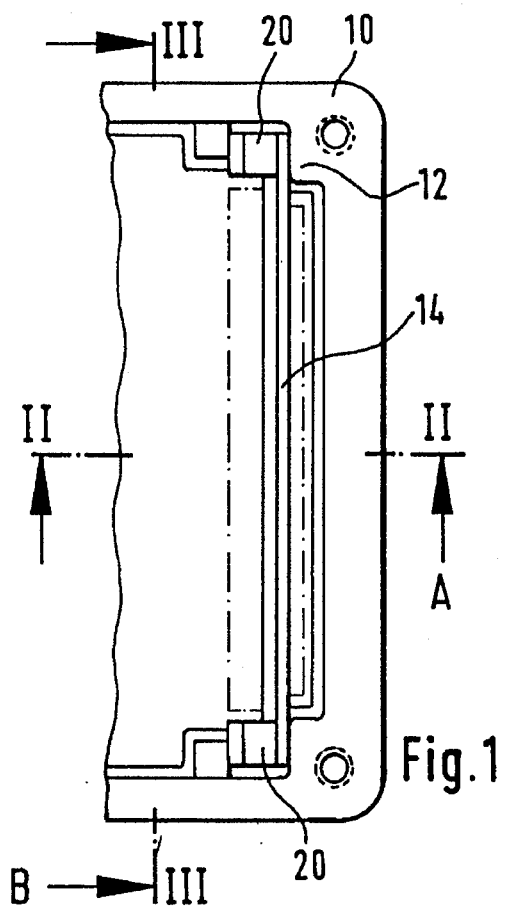
FIG. 1 is a partial plan view of an upwardly open housing of an electrical device in accordance with the present invention.

FIG. 1 shows a housing of an electrical device, in particular switching or control device for a motor vehicle which is identified with reference numeral 10. The housing 10 is composed of a heat conductive material. It is open upwardly and has for example an opening with a rectangular cross-section. Of course, other shapes of the openings are possible as well. Also, the housing can be composite and include several parts.

In accordance with an important feature of the present invention, webs 12 are formed on the inner wall of the housing 10 in two opposite corners. The webs 12 extend from the opening substantially to the bottom 13 of the housing 10. The webs 12 serve as abutments for a printed board 14. It is of course possible to provide webs in all corners, so that two printed boards can be arranged in the housing 10.

When the housing 10 is produced by die casting process, the webs 12 are formed as so-called drafts of the mold for withdrawal of the housing from the die casting mold during casting. The drafts of the mold are elements which are required during the die casting process, and thereby the already available elements are utilized for additional, new purpose. When the printed board 14, as shown in FIG. 1, is placed on the webs 12, then because of the shape of the housing 10 a space is produced both on the upper side and the lower side of the printed board 14 for arranging the electrical or electronic components. As can be seen from FIG. 2, the webs 12 or the abutment surfaces have small inclines. The inclined webs 12 are formed so that the abutment surface is inclined inwardly in an insertion direction from the opening of the housing toward the bottom of the housing and transversely to the insertion direction toward the printed board.

Figure 2:
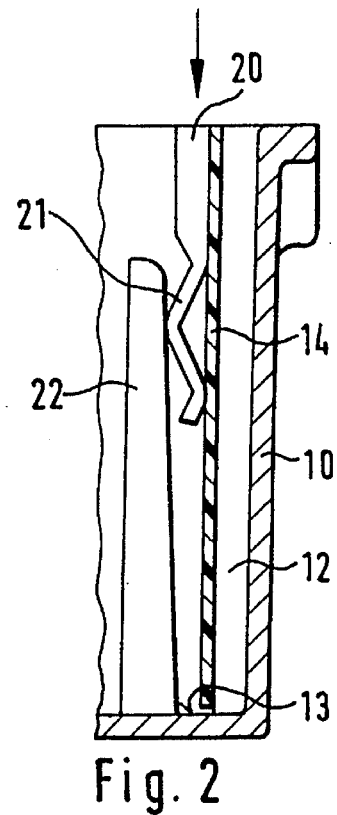
FIG. 2 is a view showing a section taken along the line II—II in FIG. 1 in direction A.
Figure 3:
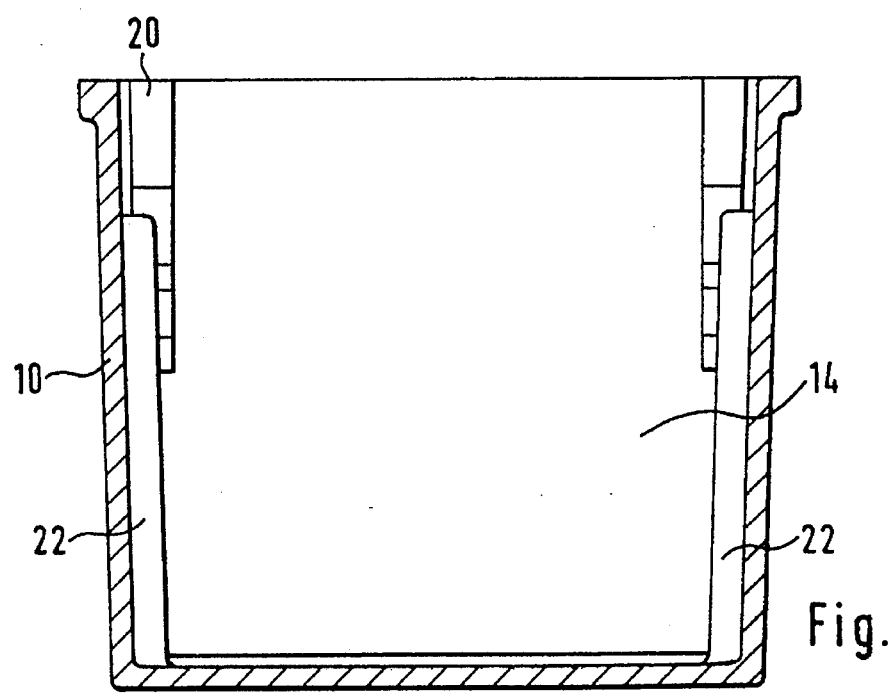
FIG. 3 is a view showing a section III—III in FIG. 1 as seen in direction B.
Figure 4:
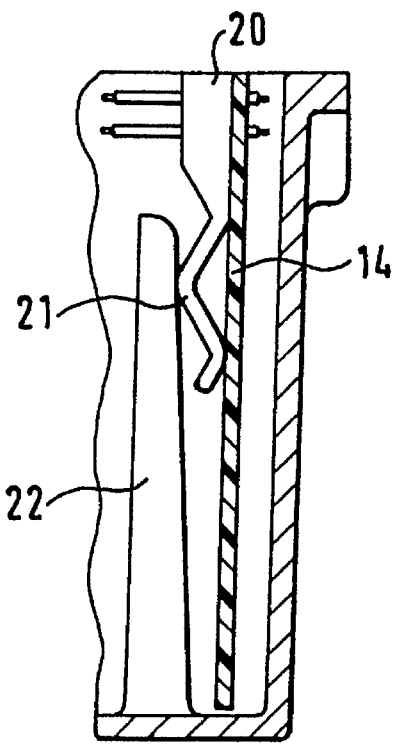
FIGS. 4 and 5 are views substantially corresponding to the views of FIGS. 2 and 3 but showing further embodiments of the invention.

The printed board 14 is fixed on the webs 12 by springs 20 which abut substantially in the region of the webs 12 on the printed board 14. The springs 20 can be formed differently. When the spring 20 is formed as an elastic part composed for example of synthetic plastic material as shown in FIG. 2, it has the elastic region with a zig-zag shaped portion 21 which abuts against a guiding pin 22 forming a counter abutment. The guiding pin 22 is formed as a pin extending from the bottom 13 into the interior of the housing. For providing a suitable pressure, the pin 22 has an incline at its side facing the printed board 14. The incline of the pin 22 is formed so that the pin is inclined in a first direction downwardly toward the bottom of the housing inwardly of the housing and also transversely to the first direction. This means that because of the incline of the pin 22 and the incline of the web 12, the distance between these structural elements to the bottom 13 insignificantly reduces. It is to be understood that one guiding pin is associated with each web.

In accordance with an especially advantageous embodiment of the invention, the springs 20 can be formed directly on the edges of the printed board. Further, it is also recommended that the springs are formed as projections which are arranged as described above on the plug strip. During insertion of the plug strip into the opening of the housing 10, simultaneously because of the springs 20 and the pin 21, the printed board is fixed on the webs 12. Due to this abutment surface, the lost heat can be withdrawn to the power components arranged on the printed board. For this purpose layers composed of good heat conductive material, such as for example copper, can be arranged between the printed board 14 and the abutment surface of the web 12. Alternatively, conventional through contactings can be used. Further, an electrical potential separation between the printed board 14 and the web 12 can be carried out by an insulating foil.

Figure 5:
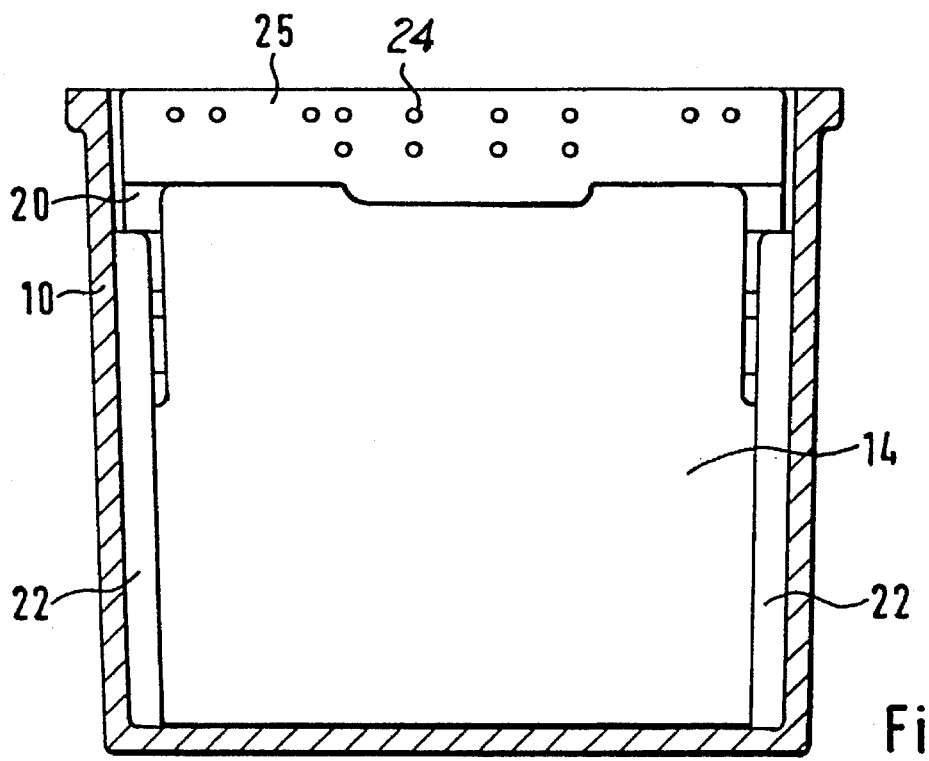

During the mounting it is possible to arrange the printed board 14 in the housing 10 with a heat withdrawal for the lost heat of the power components and without additional mounting parts. For this purpose the printed board 14 is moved into the housing by sliding along the web 12. The spring 20 abuts with its elastic region 21 on the associated guiding pin 22, or slides during the mounting along it, so that the printed board 14 is firmly fixed. As can be seen from FIG. 5, the spring 20 has a portion 25 formed as a plug strip provided with a plurality of plugs 24.

It will be understood that each of the elements described above, or two or more together, may also find a useful application in other types of constructions differing from the types described above.

While the invention has been illustrated and described as embodied in an electrical device, in particular switching or controlling device for motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed and desired to be protected by Letters Patent is set forth in the appended claims:

1. An electrical device for motor vehicle, comprising a housing having an insertion opening and a bottom; a printed board carrying an electric circuit and arranged in said housing, said housing having an inner wall provided with a plurality of webs abutting said printed board, a plurality of elastic elements located on between said printed board, pressing said printed board on said webs and a plurality of guiding elements located so that said elastic elements are arranged between said printed board and said guiding elements and slide along said guiding elements, said webs and said guiding elements being spaced from one another by a distance which reduces in a direction from said insertion opening toward said bottom inwardly of said housing.

2. An electrical device as defined in claim 1, wherein said webs have a surface which faces said guiding elements and is inclined in the direction from said insertion opening toward said bottom inwardly of said housing and also toward said guiding elements.

3. An electrical device as defined in claim 1, wherein said guiding elements have a surface which faces said printed board and is inclined in the direction from said insertion opening toward said bottom inwardly of said housing and also toward said printed board.

4. An electrical device as defined in claim 2, wherein said guiding elements have a surface which faces said printed board and is inclined in the direction from said insertion opening toward said bottom inwardly of said housing and also toward said printed board.

5. An electrical device as defined in claim 1, wherein said webs are formed integrally with said housing.

6. An electrical device as defined in claim 1, wherein said elastic elements have a free end which has a zig-zag shape.

7. An electrical device as defined in claim 1, wherein said elastic elements have a projection formed on a plug strip.

8. An electrical device as defined in claim 1, wherein said elastic elements are attached to said printed board.

9. An electrical device as defined in claim 1, wherein said elastic elements are composed of synthetic plastic material.

10. An electrical device as defined in claim 1, wherein said elastic elements are composed of metal.

11. An electrical device as defined in claim 1; and further comprising at least one heating power component provided on said printed board, said housing being composed of a heat conductive material.

\* \* \* \* \*